United States Patent [19]
Saito et al.

[11] Patent Number: 5,513,387
[45] Date of Patent: Apr. 30, 1996

[54] AUTOMATIC GAIN CONTROL CIRCUIT

[75] Inventors: Yutaka Saito, Ishikawa; Yasumi Imagawa, Kanazawa, both of Japan

[73] Assignee: Matsushita Electric Industrial Co., Ltd., Osaka, Japan

[21] Appl. No.: 76,847

[22] Filed: Jun. 15, 1993

[30] Foreign Application Priority Data

Jun. 16, 1992 [JP] Japan ..................... 4-156359

[51] Int. Cl.$^6$ ..................................... H04B 1/16
[52] U.S. Cl. ................. 455/243.1; 455/241.1; 455/249.1; 455/251.1
[58] Field of Search .............. 455/234.1, 234.2, 455/239.1, 240.1, 241.1, 242.1, 243.1, 245.1, 245.2, 246.1, 247.1, 249.1, 250.1, 251.1; 375/345

[56] References Cited

U.S. PATENT DOCUMENTS 4,330,859  5/1982  Takada ................... 455/251.1
4,355,414  10/1982 Inoue .................... 455/250.1
5,050,192  9/1991  Nawata ................... 455/245.1

FOREIGN PATENT DOCUMENTS 2-308606  12/1990  Japan .
179818    9/1991   Japan ................... 455/250.1

Primary Examiner—Reinhard J. Eisenzopf
Assistant Examiner—Thanh Le
Attorney, Agent, or Firm—Spencer & Frank

[57] ABSTRACT

In a receiver for effecting an intermittent reception operation, a reception unit including an antenna, a radio frequency amplifier, a local oscillator and a mixer, a received signal processing circuit for starting signal processing of a received signal from the reception unit after the passage of a predetermined time, a reception field level detection unit for detecting the level of the received signal and an automatic gain control unit for controlling the level of the received signal within the predetermined time and holding the controlled level after the passage of the predetermined time, are disposed in a plurality of stages.

18 Claims, 7 Drawing Sheets

AUTOMATIC GAIN CONTROL CIRCUIT

BACKGROUND OF THE INVENTION

This invention relates to an automatic gain control circuit for use in those receivers which effect an intermittent reception operation, such as a pager.

To eliminate intermodulation distortion and disturbance at the time of reception of a large input signal, a one-stage automatic gain control system has been employed in the past in FSK signal intermittent receivers such as a pager, as described in JP-A-2-308606.

The prior art system described above is mainly directed to improve intermodulation distortion characteristics at the time of a large input signal.

However, this automatic gain control system switches a gain in only one stage and holds a received signal. Therefore, this system involves the problem that gain control cannot be made in accordance with input levels over a broad range from a small input signal to a large input signal, and intermodulation distortion and disturbance, which become a practical problem, cannot be improved sufficiently. Further, this system can set only one detection point of a reception field level for gain control. Accordingly, since a reception sensitivity point after the gain control must be set to a field level lower than the field level at the detection point, the upper limit of the gain control quantity is unavoidably limited. In consequence, the gain control cannot be made sufficiently at the time of an excessive input level and intermodulation distortion characteristics become inferior.

SUMMARY OF THE INVENTION

To obviate the problems with the prior art described above, the present invention aims at providing an excellent automatic gain control circuit capable of reducing reception disturbance resulting from intermodulation distortion for input levels of a broad range from the reception of a small input signal to the reception of a large input signal in receivers for effecting intermittent reception such as a pager.

To accomplish this object, the automatic gain control circuit according to the present invention comprises reception field level detection means and a plurality of gain control means for controlling a gain in accordance with a detection level, wherein the reception field level detection means outputs a gain control signal in accordance with the reception field level, and the gain of one or a plurality of radio frequency gain control units is switched and controlled at multiple stages by this gain control signal. Besides the switching type automatic gain control circuits, an automatic gain control unit comprising one or a plurality of continuous feedback systems is added, and both of them are operated either simultaneously or sequentially.

According to the structure described above: the present invention can reduce reception disturbance resulting from intermodulation distortion for input levels over a broad range from a small input signal to a large input signal.

DESCRIPTION OF THE PREFERRED EMBODIMENTS

Hereinafter, the present invention will be described in further detail with reference to the accompanying drawings.

Figure 1:
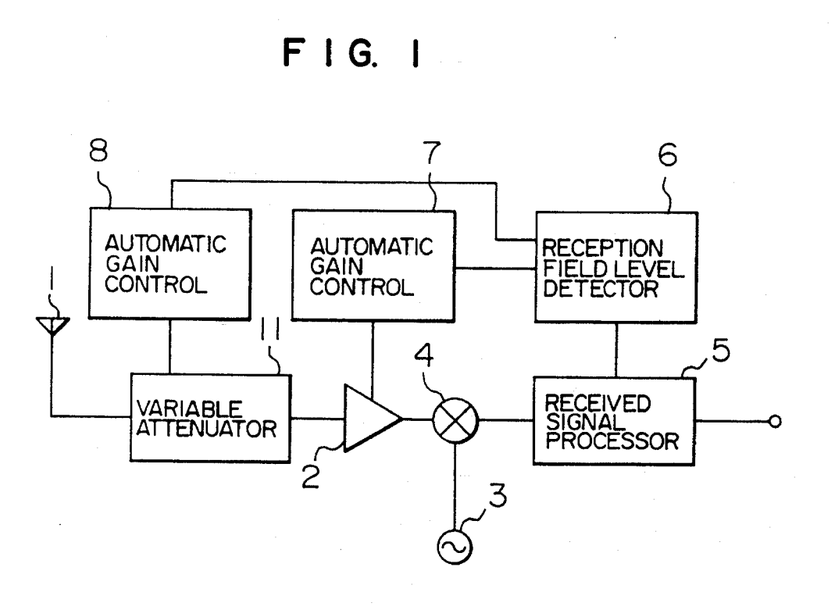
FIG. 1 is a block diagram showing the overall structure of a receiver according to the first embodiment of the present invention.

FIG. 1 is a block diagram showing the overall structure of an FSK receiver according to the first embodiment of the present invention. In this drawing, reference numeral 1 denotes an antenna and reference numeral 2 denotes an RF (radio frequency) amplifier. In the first embodiment, this RF amplifier 2 has the function of gain control. An oscillation wave of a local oscillator 3 is inputted to a mixer 4. The antenna 1 to the mixer 4 constitute reception means for controlling the level of a received signal. The RF input inputted to the mixer 4 is the output of the RF amplifier in this first embodiment. A frequency difference component between the local oscillation wave and a received carrier wave is outputted from the mixer 4, and is subjected to bandwidth limitation, amplification, FSK demodulation and wave-shaping in a received signal processing circuit 5. The signal is then outputted to a decoder (not shown). Generally, a superheterodyne system, a quadrature detection system, a direct conversion system, etc, have been employed.

In FIG. 1, reference numeral 6 denotes reception field level detection means which is added by the present invention. In this embodiment, the detection means 6 is connected to the received signal processing circuit 5. Reference numerals 7, 8 and 11 denote automatic gain control means that are added by the present invention, respectively. These means control the gain of the RF portion in accordance with the output of the reception field level detection means. In this first embodiment, the automatic gain control means control the gain of a variable attenuator 11 interposed between the antenna 1 and the RF amplifier 2 and the gain of the RF amplifier 2.

Figure 2:
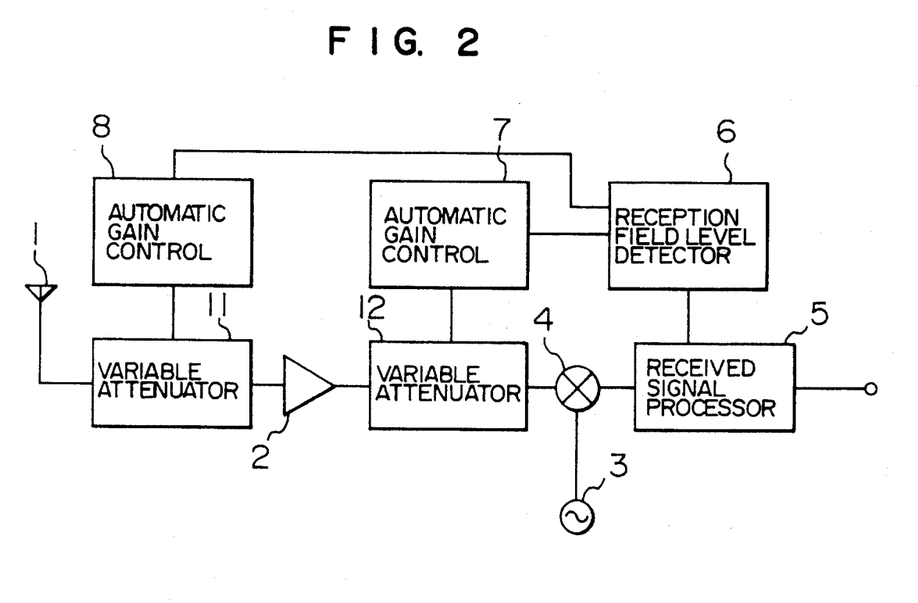
FIG. 2 is a block diagram showing the overall structure of a receiver according to the second embodiment of the present invention.

FIG. 2 is a block diagram showing the overall structure of the second embodiment of the present invention. In the drawing, like reference numerals are used to identify like constituent elements as in FIG. 1. Besides the variable attenuator 1 interposed between the antenna 1 and the RF amplifier 2, a variable attenuator 12 controlled by the automatic gain control means 7 is interposed as means for controlling the gain of the RF portion between the RF amplifier 2 and the mixer 4 so as to control the attenuation quantity of these two attenuators 11 and 12.

Figure 3:
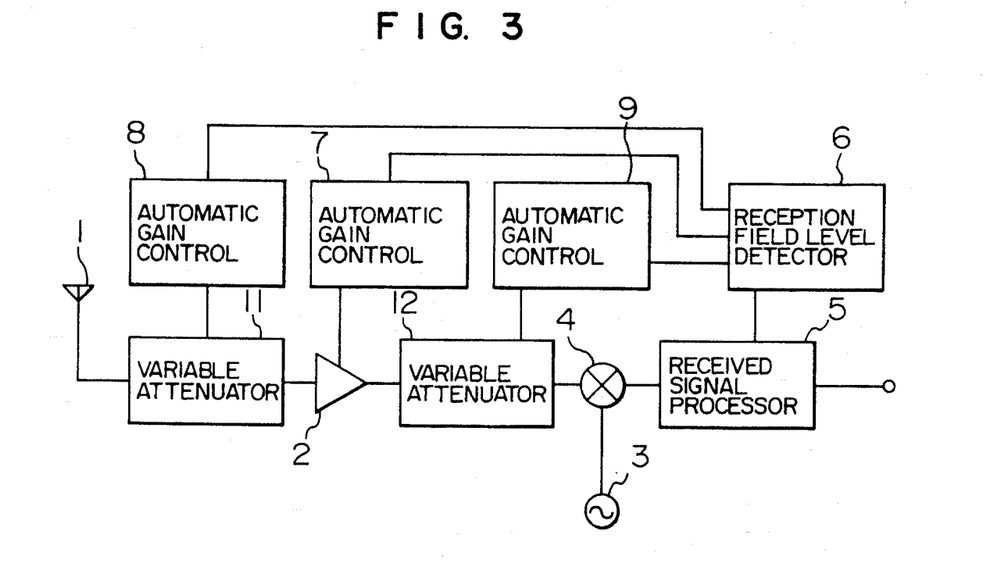
FIG. 3 is a block diagram showing the overall structure of a receiver according to the third embodiment of the present invention.

FIG. 3 is a block diagram showing the overall structure of the third embodiment of the present invention. In the drawing, like reference numerals are used to identify like constituent elements as in FIGS. 1 and 2, and this embodiment is directed to control the attenuation quantity of the variable attenuators 11, 12 and the gain of the RF amplifier 2 by the means for controlling the gain of the RF portion.

Figure 4:
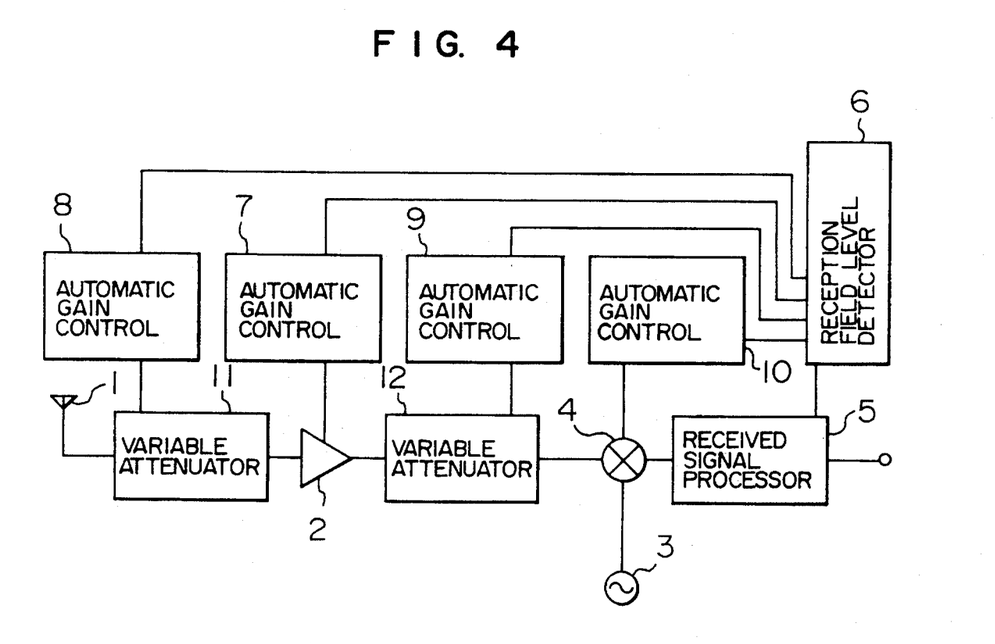
FIG. 4 is a block diagram showing the overall structure of a receiver according to the fourth embodiment of the present invention.

FIG. 4 is a block diagram showing the overall structure of the fourth embodiment of the present invention. In the drawing, like reference numerals are used to identify like constituent elements as in FIGS. 1 and 2. In this embodiment, gain control means 10 is disposed to control the gain of the mixer 4, and other means is disposed for controlling the gain of the RF portion controls the attenuation quantity of the variable attenuators 11, 12 as well as the gains of the RF amplifier 2 and the mixer 4.

In the block diagrams of FIGS. 1 to 4 showing the overall structures of the four foregoing embodiments, the reception blocks 2 to 5 are controlled to intermittently effect the reception operation by an intermittent reception operation signal. The operation of the reception field level detection means 6 added by the present invention and the operation of the automatic gain control means 7 to 12 are controlled by a control signal which is in synchronism with this intermittent reception operation control signal.

Figure 5:
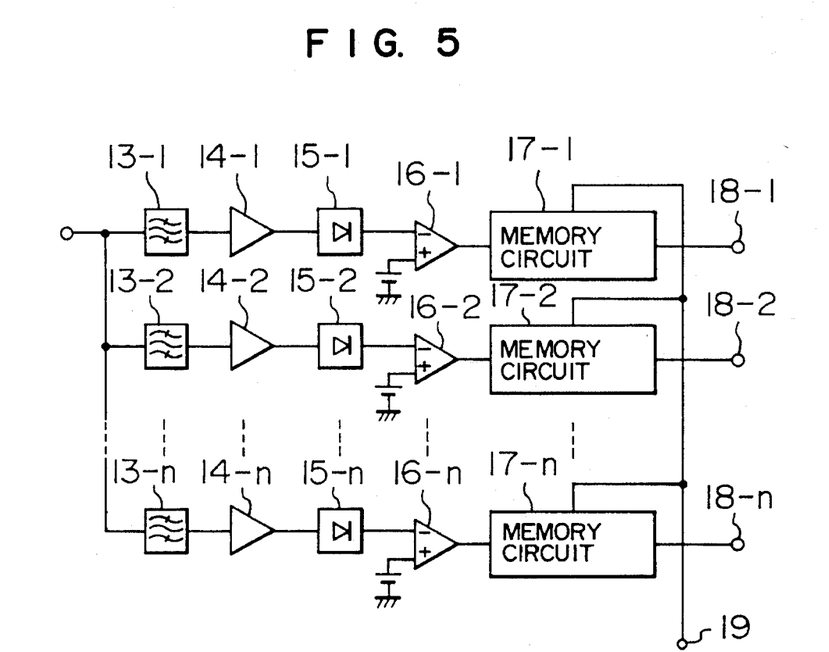
FIG. 5 is a block diagram showing the structure of reception field level detection means in the present invention.

FIG. 5 is a block diagram showing the structure of the reception field level detection means in this embodiment of the present invention. Band-pass filters 13-1 to 13-n and amplifiers 14-1 to 14-n limit the band of low frequency signals and amplify the signals to such a level as to be detectable by level detectors 15-1 to 15-n.

Comparators 16-1 to 16-n set memory circuits 17-1 to 17-n when the outputs of the level detectors 15-1 to 15-n exceed a predetermined level, and output and hold the gain control signals 18-1 to 18-n. The memory circuits 17-1 to 17-n are reset when an external reset signal 19 is inputted. Each memory circuit 17-1 to 17-n comprises a capacitor, a latch, a flip-flop, a RAM, and so forth. Level detection points of n stages can be set in accordance with reception field levels in a broad range by setting the gains of n amplifiers 14-1 to 14-n or comparison reference voltages of n comparators 16-1 to 16-n to mutually different values in FIG. 5. Accordingly, n gain control signals 18-1 to 18-n can be outputted and held.

Figure 6:
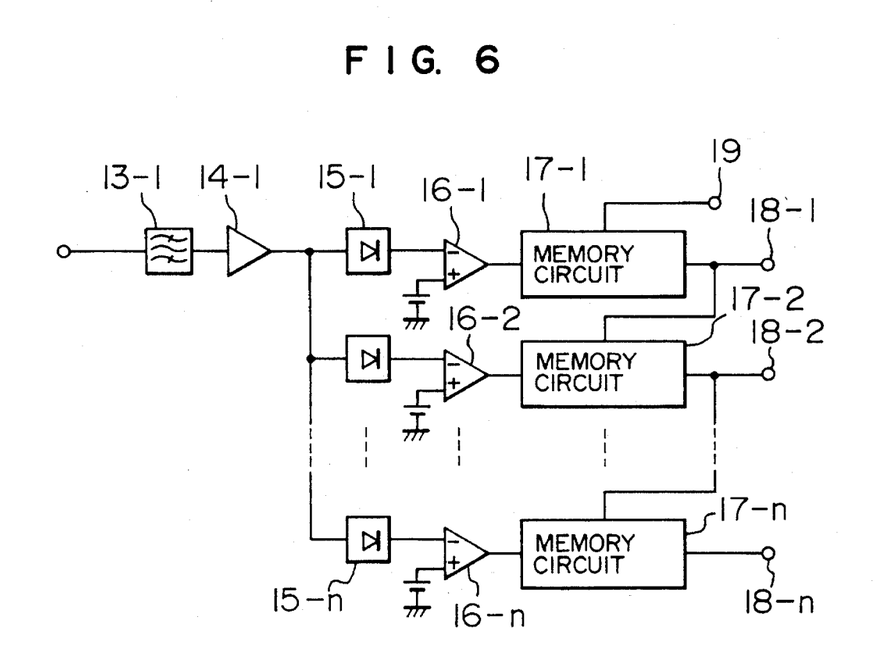
FIG. 6 is a block diagram showing the structure of another reception field level detection means in the present invention.

FIG. 6 is a block diagram showing an example of another reception field level detection means in the embodiment of the present invention. In FIG. 6, like reference numerals are used to identify like constituent elements is in FIG. 5. The output of a single band-pass filter 13-1 and the output of a single amplifier 14-1 are inputted in common to the level detectors 15-1 to 15-n. This embodiment employs the structure which generates the reset signal by the output signal of the memory circuit of the preceding stage so that the reset signal input of the memory circuit 17-2 is used as the gain control signal output 18-1 of the memory circuit 17-1 and similarly, the reset signal input of the memory circuit 17-n is used as the gain control signal output of the memory circuit 17-n-1.

Figure 7:
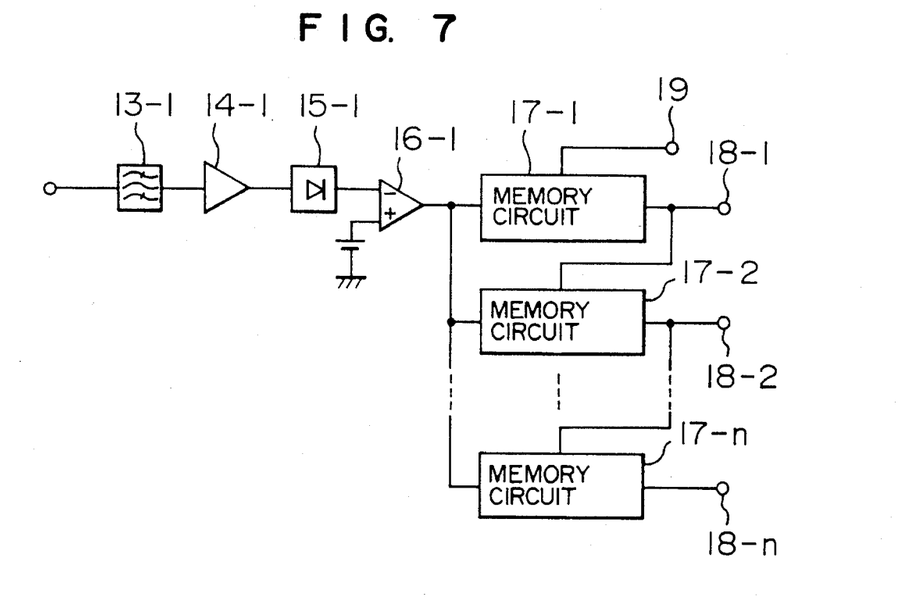
FIG. 7 is a block diagram showing the structure of still another reception field level detection means in the present invention.

FIG. 7 is a block diagram showing an example of still another reception field level detection means. In the drawing, like reference numerals are used to identify like constituent elements as in FIG. 6. The output of the single comparator 16-1 is inputted in common to the memory circuits 17-1 to 17-n.

Next, the operation timing of the reception field level detection means shown in FIGS. 6 and 7 will be explained with reference to FIGS. 9A to 9F.

Figure 9A:
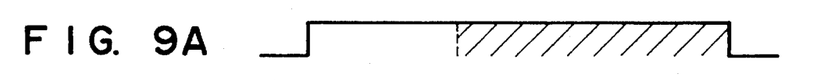
FIGS. 9A to 9F are timing charts showing operation timings in the present invention.

FIG. 9A is a chart showing the intermittent reception operation signal, and a hatched portion represents the data portion which is to be received by a certain receiver. An intermittent reception operation control signal is set so that the reception operation is effected at the time "H" but is not effected at the time of "L", and is controlled by a synchronization circuit inside the receiver so that the reception operation is carried out only when the data to be received by this receiver is transmitted. The reason why the reception-start timing by the intermittent reception operation control signal shown in FIG. 9A is somewhat earlier than the hatched portion in FIG. 9A is because a certain period of time is necessary before the reception block enters a stable reception state after the start of its reception operation.

Figure 9B:
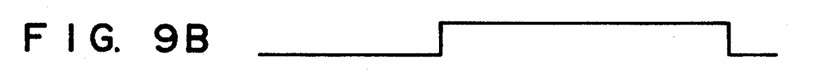

In FIGS. 9A to 9F, the reception-start timing is set to an early timing by the amount of time equal to the sum of the time necessary for the reception block to enter the stable reception state described above and the time necessary for the automatic gain control circuit of the invention to complete its automatic gain control operation. FIGS. 9B to 9F show the operating timing of the automatic gain control system according to the present invention, and two-stage control is shown for ease of explanation. FIG. 9B shows the set signal of the reception field level detection portion. Reception field level detection and gain control of the RF portion are carried out when the signal is "L", while the reception level detection operation is completed and the controlled gain is held at the time of "H".

Figure 9C:
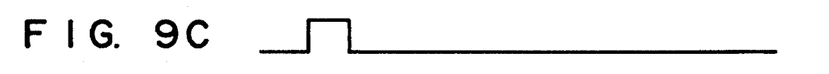
Figure 9D:
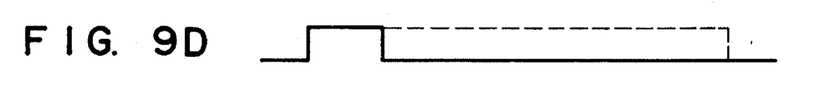
Figure 9E:
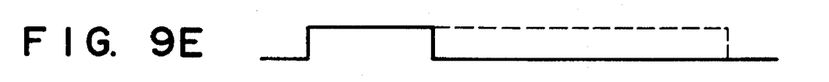

FIG. 9C shows the reset signal in FIGS. 6 and 7. When this signal is "H", the memory circuit 17-1 is reset and is brought to "H". When the reset signal 19 is "L", the memory circuit is brought into the state where it can be set. FIG. 9D shows the gain control signal output 18-1 of the memory circuit 17-1. When this signal is "H", the gain of the RF portion is controlled to the maximum and when the signal is "L", the gain of the RF portion is decreased. The signal of the gain control signal output 18-1 in FIG. 9D is also inputted as the reset signal of the memory circuit 17-2 and controls its operation. FIG. 9E shows the gain control signal output 18-2 of the memory circuit 17-2, and is set to control the gain of the reception block other than the gain of the RF portion controlled by the gain control signal output 18-1. In consequence, the gain of the RF portion is controlled to the maximum when this signal output 18-2 is "H", and is decreased when it is "L".

The operation timing described above will be explained in further detail. The memory circuit 17-1 is reset by the reset signal shown in FIG. 9C, the memory circuit 17-2, too, is reset when the signal of FIG. 9D is "H" and the signal of FIG. 9C becomes "H", so that the gain of the RF portion is controlled to the maximum.

If the reception field level is such that when the signal shown in FIG. 9C falls thereafter to the "L" level and reset is released, the output of the comparator 16-1 sets the memory circuit 17-1, the signal shown in FIG. 9D becomes "L" and operates to decrease the gain of the reception block which is set to be controlled by the signal of FIG. 9D. When the signal shown in FIG. 9D becomes "L", the reset of the memory circuit 17-2 is released and furthermore, the reception field level detection operation is started. At this time, control is made to decrease the gain of the RF portion by the signal shown in FIG. 9D, and the reception field level greater by this decrement of the gain is the detection level to which the memory circuit 17-2 is set. When the reception field level is the level to which the memory circuit 17-2 is set, the signal shown in FIG. 9E becomes "L" and operates to decrease the gain of the reception block which is set to be controlled by the signal shown in FIG. 9E.

Figure 9F:
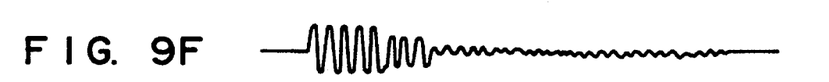

Thereafter, the signal shown in FIG. 9B becomes "H", the reception field level detection operation is completed and the gain control signal outputs 18-1 and 18-2 are held. The explanation given above deals with the case where the reception field level exceeds the detection point and the gain control is effected for both of the two stages, and the reception signal output in this case is such as shown in FIG. 9F. When detection is made for only one stage, only the signal shown in FIG. 9D becomes "L" and the signal shown in FIG. 9 is retained at "H" (dotted line). When the reception field level does not reach the detection point of the first stage, the gain control is not effected and the gain control signal is held at "H" as indicated by the dotted line in FIGS. 9D and 9E. Though the explanation is given only about an example of the operation timing, the practical operation timing is not particularly limited to this timing.

Figure 10:
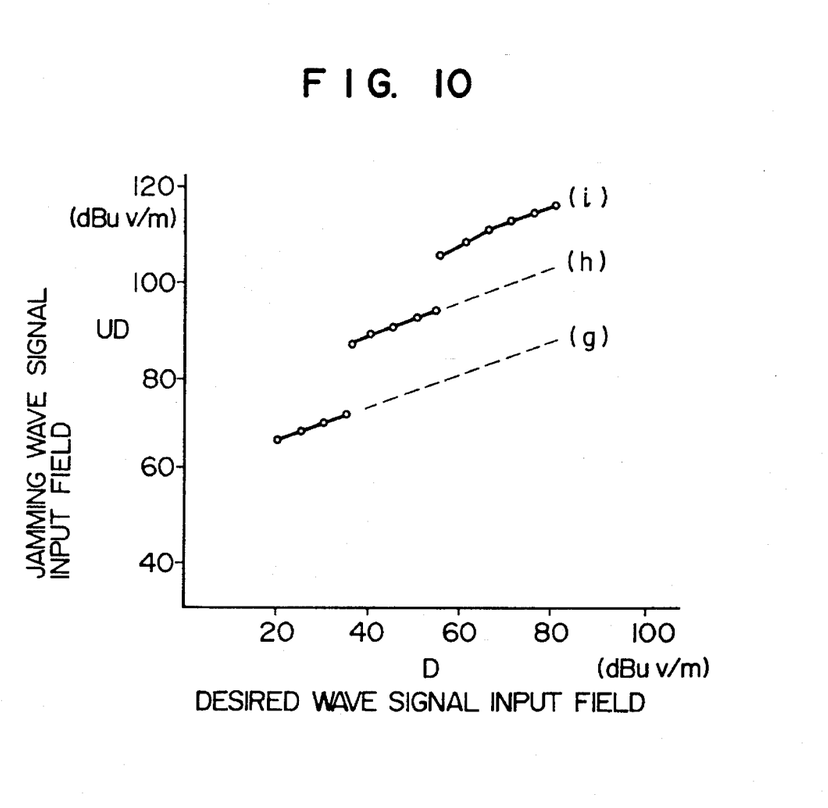
FIG. 10 is a graph showing the effect of the present invention.

Next, the effects of the embodiments of the present invention will be explained with reference to FIG. 10. FIG. 10 is a graph showing the relation between an input field level of a desired wave and an input field level of two-wave jamming waves which generate reception jamming by third order intermodulation distortion. When the input field level of the jamming wave is above a solid line with respect to the input field level of the desired wave, reception jamming occurs due to intermodulation distortion and correct signals cannot be received. Here, the solid line and the dotted line (g) in FIG. 10 represent the characteristics when the automatic gain control method is not utilized, and the solid line and the dotted line (h) represent the characteristics when the gain control of the first stage operates. Further, the solid line (i) in FIG. 10 represents the characteristics when the gain control of the first stage and furthermore, the gain control of the second stage, too, operate.

In other words, FIG. 10 shows the characteristics when the automatic gain control system of the second stage according to the present invention is utilized, and the solid line with white circles o represents the collective characteristics of the receivers. By the way, assuming that the gain control of only the first stage operates when the input field level of the desired wave exceeds 35 dBuV/m, for example, then, the characteristics become as represented by the solid line (h) in FIG. 10 when the input field level of the desired wave is within the range of 35 to 55 dBuV/m, and become as represented by the dotted line (h) in FIG. 10 when the input field level of the desired wave exceeds 55 dBuV/m. The characteristics represented by the solid line (i) can be obtained by setting the gain control of the second stage to operate when the input field level of the desired wave exceeds 55 dBuV/M.

According to this embodiment, therefore, the correct signals can be received over a broad range of the range of a desired wave-v-jamming wave ratio that has not been accomplished by the conventional one-stage automatic gain control method. Though this embodiment utilizes the two-stage automatic gain control method for convenience' sake, a large desired wave-v-jamming ratio can be obtained over a broad range from a very small input field level to a large input field level by disposing a large number of detection points of input field levels, a large number of stages of gain control and a large number of gain damping quantities and executing suitable gain control at a large number of stages in accordance with the input field level at each detection point.

Figure 8:
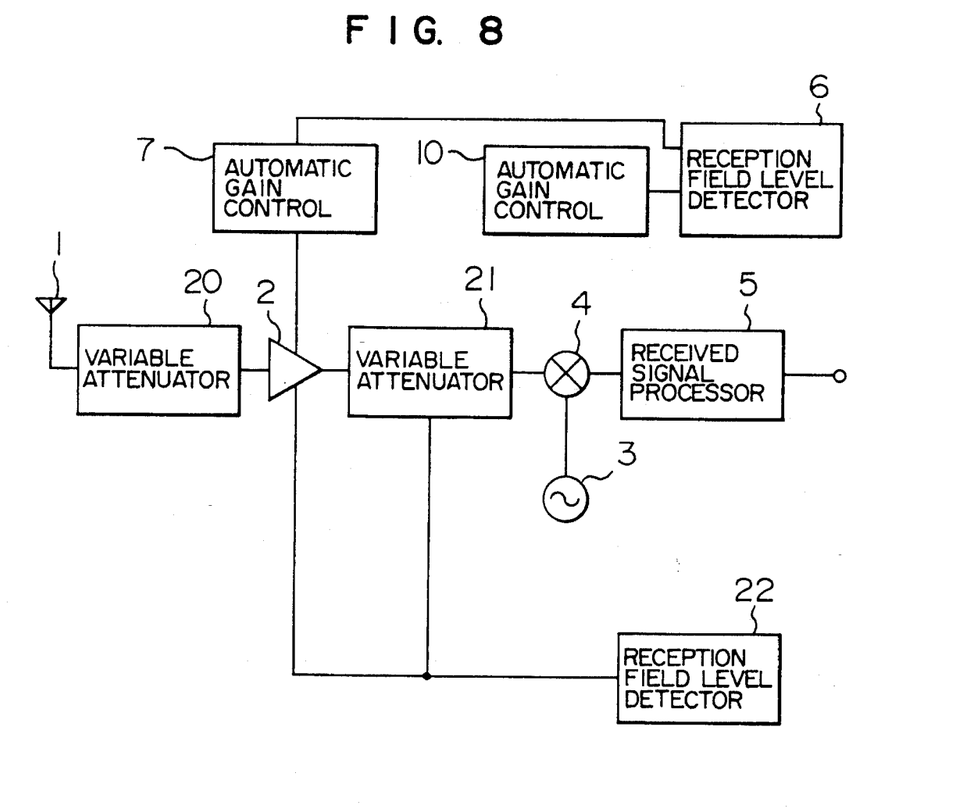
FIG. 8 is a block diagram showing the overall structure of a receiver according to the fifth embodiment of the present invention.

Next, another embodiment of the present invention will be explained. FIG. 8 is a block diagram showing the overall structure of the fifth embodiment of the present invention. In FIG. 8, like reference numerals are used to identify like constituent elements as in FIGS. 1 to 4. In this embodiment, automatic gain control means 20, 21, 22 constituted by a continuous feedback system are added besides the change-over type multi-stage gain control means 6, 7, 10. The variable attenuators 20, 21 can continuously vary the damping quantity by the gain control signal outputted from the reception field level detection means 22, constitute the continuous feedback system in cooperation with the RF amplifier 2, the mixer 4 and the received signal processing circuit 5, and operate to keep the input level of the received signal processing circuit always constant.

When the input signal is so small or so great that the continuous feedback system described above alone cannot control the gain, this fifth embodiment controls the gain continuously and step-wise over a broad range of the input field levels by the conjoint use of the multi-stage gain control method constituted by the multi-stage gain control means 6, 7, 10, and can obtain a large desired wave-v-jamming wave ratio.

Figure 11:
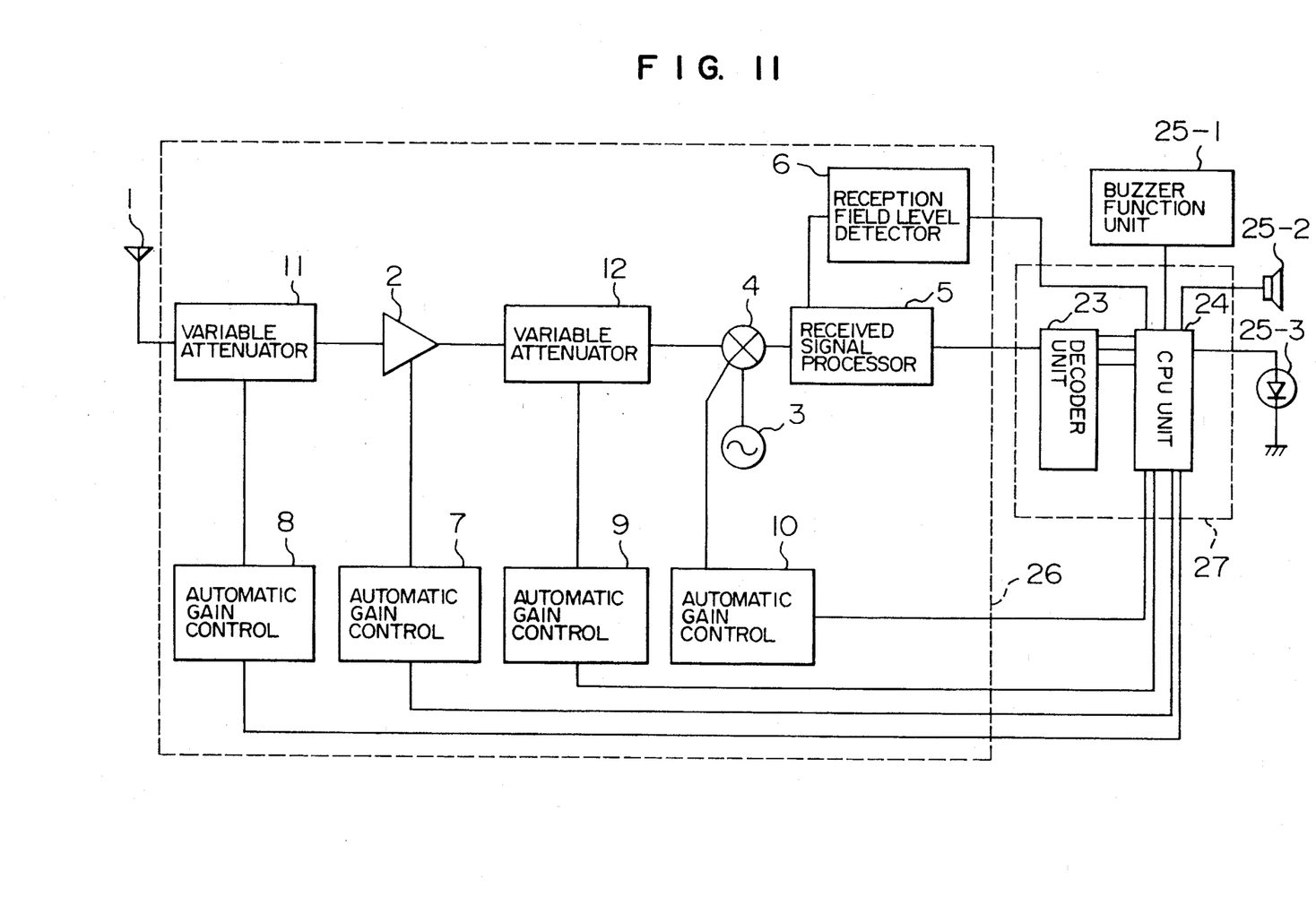
FIG. 11 is a block diagram showing the overall structure of a receiver according to the sixth embodiment of the present invention.

FIG. 11 is a block diagram showing the overall structure of the sixth embodiment of the present invention. In this drawing, like reference numerals are used to identify like constituent elements as in FIGS. 1 to 4. This embodiment includes a digital signal processing unit 27 comprising a decoder unit 23 and a CPU unit 24, and is generally constituted by CMOSLSI device, etc. A display unit and a buzzer function unit represented by reference numerals 25-1 to 25-3 are controlled by the CPU unit 24. In this sixth embodiment, the output of the reception field level detection means 6 is inputted to the CPU unit 24, and the A/D converter, etc, detects the reception field level so that the gain control signal in accordance with this level is outputted to the automatic gain control means 7 to 10 and multi-stage gain control is effected. In the drawing, reference numeral 26 denotes the reception unit inclusive of the automatic gain control method, and this unit can be constituted by discrete components or a part or the entire part of this unit can be constituted by bipolar ICs, or the like, in an integrated circuit construction.

Next, examples of the gain control means and variable attenuator in the first to sixth embodiments of the present invention will be explained with reference to FIGS. 12 to 15.

Figure 12:
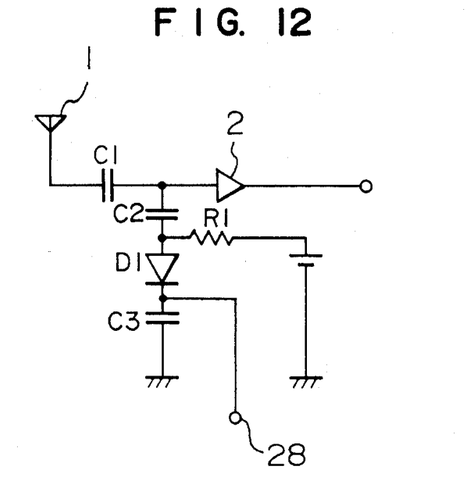
FIG. 12 is a circuit diagram showing the structure of gain control means in the present invention.

FIG. 12 is a circuit diagram showing an example of the structure of the variable attenuator in the embodiments of the present invention. In this drawing, the received signal inputted from the antenna 1 is inputted to the RF amplifier 2 through a coupling capacitance C1. In this embodiment, a capacitance switch circuit comprising D1, C2, C3 and R1 is disposed at the input terminal of the RF amplifier 2 and is controlled by the gain control signal 28 to change over the damping quantity. Symbol C2 represents an RF damping capacitance, C3 is an RF bypass capacitance, D1 is an RF switching diode and R1 is a current limiting resistor.

Figure 13:
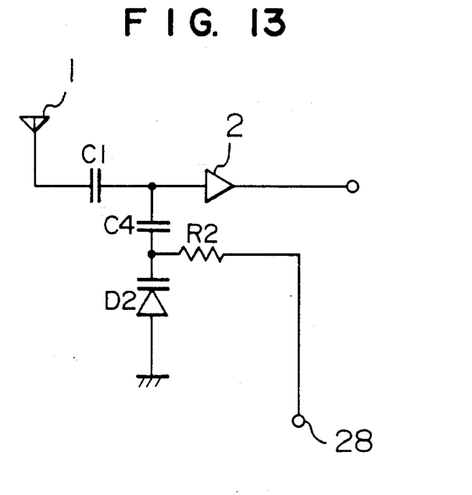
FIG. 13 is a circuit diagram showing the structure of another gain control means in the present invention.

FIG. 13 is a circuit diagram showing the structure of another example of the variable attenuator in the embodiments of the present invention, and like reference numerals are used to identify like constituent elements as in FIG. 12. A variable capacitance circuit comprising C4, D2 and R2 is controlled by the gain control signal 28 so that the damping quantity can be varied. Symbol C4 represents an RF bypass capacitance, D2 is a variable capacitance diode and R2 is an RF component inhibiting resistor.

In the examples shown in FIGS. 12 and 13, the variable attenuator is interposed between the antenna 1 and the RF amplifier 2 but a similar variable attenuator can also be interposed between the RF amplifier 2 and the mixer 4.

Figure 14:
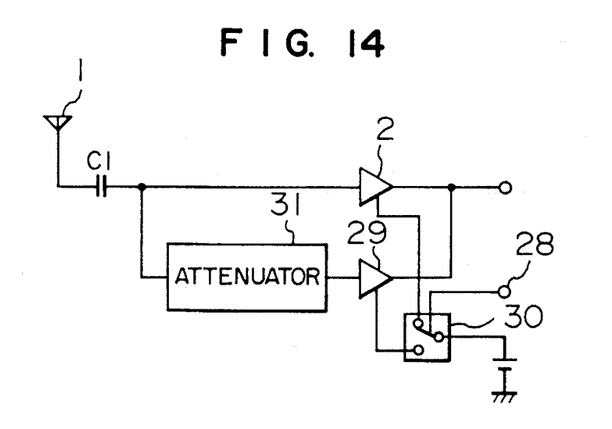
FIG. 14 is a circuit diagram showing the structure of still another gain control means in the present invention.

FIG. 14 is a circuit diagram showing the structure of another example of the gain control means in the embodiment of the present invention, and like reference numerals are used to identify like constituent elements as in FIGS. 12 and 13. This circuit includes gain control means comprising a low gain RF amplifier 29, a switch circuit 30 and an attenuator 31. The operation of the RF amplifier 2 as well as that of the low gain RF amplifier 29 are controlled by the switch circuit 30 in accordance with the gain control signal 28 so that the RF amplifier 2 operates when the gain control is not effected, and the low gain RF amplifier 29 operates when the gain control is effected. In this way, the RF signal is amplified with a low gain and low distortion characteristics through the attenuator 31. Though the explanation given above illustrates the examples of the RF amplifier, a similar structure can also be used for the mixer 4, too, and both of the RF amplifier 2 and the mixer 4 may have a similar structure.

Figure 15:
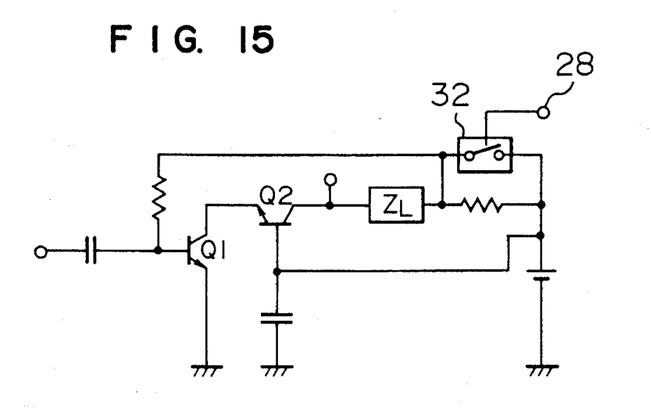
FIG. 15 is a circuit diagram showing the structure of still another gain control means in the present invention.

FIG. 15 is a circuit diagram showing the structure of still another example of the gain control means in the embodiments of the present invention. The example shown in FIG. 15 represents a cascade type RF amplification circuit used generally in a pager or the like, and the gain is made variable by changing over the current to the cascade type RF amplification circuit comprising $Q_1$ and $Q_2$.

In the embodiments of the present invention explained in the foregoing, the reception unit and the gain control circuit according to the present invention may be constituted by discrete components and a part, or the entire part, of the circuit may be integrated, as well. Further, the present invention can be applied to a superheterodyne system, a direct conversion system and various other reception systems.

As described above in detail, in the receiver for effecting the intermittent reception operation, the present invention disposes the reception field level detection means and the automatic gain control means for controlling the gain in accordance with the detection level in a plurality of stages, and controls the gain at multiple stages or continuously in accordance with the reception field level over a broad range of the reception field level. Accordingly, the present invention can provide the excellent effect of highly eliminating the intermodulation distortion in a wide range of reception field levels ranging from the input of the very fine signal to the input of the large signal.

We claim:

1. An automatic gain control circuit comprising:

reception means for adjusting a level of an intermittently received signal having an information portion, the reception means including multiple gain stages comprising first and second gain stages each having a controllable gain;

received signal processing means, coupled to receive the intermittently received signal from the reception means, for processing the information portion of the intermittently received signal after a predetermined period of time from when said intermittently received signal is received from said reception means;

reception field level detection means for detecting a level of an electric field of said intermittently received signal and producing, during successive gain control operations of the first and second gain stages, respectively, a first gain control quantity based on a first reception field level detection point and a second gain control quantity based on a second reception field level detection point that is determined by the first gain control quantity for executing a multi-stage gain control; and a plurality of automatic gain control means for controlling the gain of the first and second gain stages of said reception means in accordance with the first and second gain control quantities, respectively, for adjusting the level of the intermittently received signal within said predetermined period of time and holding said controlled gain after said predetermined period of time elapses, wherein there is a predetermined time delay after the gain control operation of the first gain stage until start of the gain control operation of the second gain stage and the second reception field level detection point is determined after the gain control operation of the first stage is completed.

2. An automatic gain control circuit according to claim 1, wherein the plurality of said automatic gain control means includes an automatic gain control unit comprising at least one continuous feedback system in the multi-stage gain control circuit.

3. An automatic gain control circuit according to claim 1, wherein said reception means includes a variable attenuator provided between an antenna and a radio frequency amplifier, and said automatic gain control means controls an attenuation quantity of said variable attenuator.

4. An automatic gain control circuit according to claim 1, wherein said reception means includes a radio frequency amplifier for amplifying said intermittently received signal, and said automatic gain controls means control the gain of said radio frequency amplifier.

5. An automatic gain control circuit according to claim 1, wherein said reception means includes a variable attenuator provided between a radio frequency amplifier and a mixer, and said automatic gain control means controls an attenuation ratio of said variable attenuator.

6. An automatic gain control circuit according to claim 1, wherein said automatic gain control means controls a conversion gain of a mixer provided as part said reception means.

7. An automatic gain control circuit according to claim 1, wherein said reception field level detection means includes an amplification circuit, a level detection circuit coupled to an output of the amplification circuit, a comparator coupled to an output of the level detection circuit and a memory circuit coupled to an output of the comparator.

8. An automatic gain control circuit according to claim 1, wherein said reception field level detection means includes a plurality of memory circuits connected in parallel with each other.

9. An automatic gain control circuit according to claim 1, wherein said reception field level detection means includes at least one amplifier and a plurality of reception field level detection circuits coupled to an output of the amplifier.

10. An automatic gain control circuit according to claim 1, wherein said reception field level detection means includes a plurality of memory circuits connected in parallel with each other, a first one of the memory circuits outputting the first gain control quantity, the first gain control quantity being related to the detected level of the electric field and operating as an operation control signal for resetting another memory circuit of said plurality of memory circuits.

11. An automatic gain control circuit according to claim 1, further comprising a CMOSLSI device, the CMOSLSI device comprising a decoder and a microprocessor connected to the decoder.

12. An automatic gain control circuit according to claim 1, wherein said gain control means includes a device selected from the group consisting of a radio frequency switching diode and a variable capacitance diode.

13. An automatic gain control circuit according to claim 1, wherein said plurality of gain control means includes a switching circuit for switching a gain of a radio frequency amplifier or a mixer for changing an input dynamic range of the reception means.

14. An automatic gain control circuit according to claim 1, wherein said at least one of the gain stages of said reception means includes a first gain device connected in parallel with a second gain device and having an attenuation circuit connected to an input of the second gain device, the first and second gain devices being selectably controlled for adjusting the level of the intermittently received signal.

15. An automatic gain control circuit according to claim 1, wherein at least one of the gain stages of the reception means includes a plurality of gain control units and the plurality of automatic gain control means selects and controls at least one gain control unit in accordance with the detected field level of the electric field.

16. An automatic gain control circuit according to claim 1, wherein an overall gain quantity of the reception means is switched in the multiple stages for executing the multi-stage gain control.

17. An automatic gain control circuit according to claim 1, wherein the reception means includes an attenuation stage and a radio frequency amplifier coupled to an output signal of the attenuation stage, the attenuation stage and the radio frequency amplifier each having gains controlled by corresponding automatic gain control means, the gain of said radio frequency amplifier being controlled when a small intermittently received signal is received, and the gain of the attenuation stage is controlled when a large intermittently received signal is received.

18. An automatic gain control circuit according to claim 1, wherein detection of the level of an electric field by said reception field level detection circuit is stopped when the gain control of the reception means is completed or after a predetermined time elapses from completion of the gain control of the reception means.

\* \* \* \* \*